(12) United States Patent
Hull et al.

(10) Patent No.: US 7,529,075 B1
(45) Date of Patent: May 5, 2009

(54) SYSTEMS AND METHODS INVOLVING ELECTRIC-FIELD CAGES

(75) Inventors: David M. Hull, Adelphi, MD (US); Stephen J. Vinci, Ellicott City, MD (US); William T. Fraser, Jr., Edgewater, MD (US); Philip N. Repicky, Silver Spring, MD (US); Luke E. Sturdevant, Horseheads, NY (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 435 days.

(21) Appl. No.: 11/513,437

(22) Filed: Aug. 23, 2006

Related U.S. Application Data

(60) Provisional application No. 60/713,617, filed on Aug. 23, 2005.

(51) Int. Cl.
*H01G 7/02* (2006.01)
(52) U.S. Cl. .................................................. 361/233
(58) Field of Classification Search ................. 361/233, 361/230
See application file for complete search history.

(56) References Cited

U.S. PATENT DOCUMENTS 4,213,844 A * 7/1980 Morimoto et al. ...... 204/298.05
4,652,318 A * 3/1987 Masuda et al. ........... 156/89.19

OTHER PUBLICATIONS

Horn, et al., "Electrostatic Cage "Stark Barrel" for Rapidly Switching a Uniform Electric Field Through Arbitrary Angles," Review of Scientific Instruments, vol. 69, No. 12, Dec. 1998, pp. 4086-4093.
IEEE Guide for the Measurement of Quasi-Static Magnetic Fields, IEEE 1460—1996.
IEEE Standard Procedures for Measurement of Power Frequency Electric and Magnetic Fields from AC Power Lines, 1995.
IEEE Standard Procedures for the Measurement of Electric and Magnetic Fields from Video Display Terminals (VDTs) from 5 Hz to 400 kHz.

(Continued)

*Primary Examiner*—Stephen W Jackson
*Assistant Examiner*—Ann T Hoang
(74) *Attorney, Agent, or Firm*—Edward L. Stolarun

(57) ABSTRACT

A representative system for providing an electric field comprises an electrically insulated frame, guard members and endplates. The frame incorporates a top, a bottom, opposing sides and opposing ends, with the sides extending between the top and the bottom. Each of the ends engages the top, the bottom and the sides. The frame defines an interior. The guard members are suspended within the interior of the frame, with each of the guard members being formed of metal tubing. The guard members are spaced from each other and located along a length of the frame such that the guard members are oriented substantially parallel to the ends of the frame. The endplates are positioned at the ends of the frame. The frame, guard members and endplates are operative to form an electric field within the interior of the frame responsive to an electric potential being applied to at least one of the endplates.

20 Claims, 9 Drawing Sheets

OTHER PUBLICATIONS

IEEE Guide for the Measurement of DC Electric-Field Strength and Ion Related Quantities, IEEE Std. 1227—1990.

IEEE Recommended Practice for Instrumentation: Specifications for Magnetic Flux Density and Electric Field Strength Meters—10 Hz to 3 KHz, IEEE Std. 1308—1994.

IEEE Standard for Calibration of Electromagnetic Field Sensors and Probes, Excluding Antennas, from 9 kHz to 40 GHz, IEEE Std. 1309—1996.

IEEE Standard for Safety Levels with Respect to Human Exposure to Electromagnetic Fields, 0-3 kHz, IEEE Std. C95.6™ 2002.

Pavic, et al., "An Accurate Calculation of the Reference Electric Field Nonuniformity," IEEE 2000, pp. 425-426.

Chubb, "Methods for the Calibration of Electrostatic Instruments."

Bottauscio, et al., "Generation of Reference Electric and Magnetic Fields for Calibration of Power-Frequency Field Meters," IEEE Transaction on Instrumentation and Measurement, vol. 42, No. 2, Apr. 1993.

* cited by examiner

SYSTEMS AND METHODS INVOLVING ELECTRIC-FIELD CAGES

CROSS REFERENCE TO RELATED APPLICATIONS

This application is a Utility application that claims priority to co-pending U.S. Provisional Patent Application No. 60/713,617 entitled "Electric-Field Cage," filed Aug. 23, 2005, which is incorporated by reference herein.

GOVERNMENT INTEREST

The invention described herein may be manufactured, used, and licensed by or for the United States Government.

BACKGROUND OF THE INVENTION

1. Field of the Invention

This invention pertains generally to electric field generation.

2. Description of the Related Art

Electric-field sensor technology relates to applications such as electrostatic proximity sensing (EPS) for anti-aircraft projectile fuzing applications; unattended ground sensors (UGS) for detection, classification, and identification of helicopters and other aircraft; localization and tracking of aircraft and other airborne objects in flight; and other intelligence, surveillance, and reconnaissance (ISR) applications. Electric-field sensors have also been used to measure atmospheric E-fields for lightning research and safety during rocket launch operations.

As used herein, the term electric field (E-field) refers to a quasi-static field; that is, one in which the charge relaxation time is short compared to the period of the highest source frequency or any movement of the boundary conditions (source, cluttered environment, and sensor). In a quasi-static field, the charge is assumed to move with the boundary conditions, and the resulting electric currents are so small that the magnetic field can be neglected. The sensors described above may be referred to as E-field anomaly detectors, and are analogous to the more well known magnetic anomaly detectors that have been used since World War II to detect distortions in, or modulations of, an external magnetic field (typically the Earth's magnetic field).

Some electric-field sensors are ground-based; that is, the Earth (or the platform upon which the sensor is mounted) becomes the reference electrode. Other E-field sensors are electrically floating; they may be flying, or they may be suspended in such a way that they form a complete sensor by themselves. Some ground-based E-field sensors are flush-mounted, while others stand upright from their mounting surface. Some sensors are small, with dimensions on the order of millimeters or centimeters, while others are large, with dimensions on the order of meters. Some sensors respond to DC fields, while others only respond to electric fields in various frequency bands.

Such sensors have been designed for various applications. Some are designed for atmospheric field research, including thundercloud formation and lightning safety studies. Some are designed for detection of aircraft outdoors, while others are designed primarily to detect humans indoors. Many different kinds of electric-field sensors are used to detect and/or characterize power lines. All these sensors are different sizes and shapes, and have different functions, yet they all share a common need for reliable, accurate calibration and/or testing in repeatable, laboratory conditions.

SUMMARY OF THE INVENTION

Systems and methods for providing electric fields are provided. In this regard, an embodiment of such a system comprises an electrically insulated frame, guard members and metal endplates. The frame incorporates a rectangular top, a rectangular bottom, rectangular opposing sides and rectangular opposing ends, with the sides extending between the top and the bottom. Each of the ends engages the top, the bottom and the sides. The frame defines an interior. The guard members are suspended within the interior of the frame, with each of the guard members being formed of metal tubing exhibiting a circular cross section. The tubing is shaped such that each of the guard members is rectangular. The guard members are spaced from each other and located along a length of the frame such that the guard members are oriented substantially parallel to the ends of the frame. The metal endplates are positioned such that a first of the endplates is located at a first of the ends and a second of the endplates is located at a second of the ends. The frame, guard members and endplates are operative to form an electric field within the interior of the frame responsive to an electric potential being applied to at least one of the endplates.

Another embodiment of a system for providing an electric field comprises an electrically insulated frame, guard members and endplates. The frame incorporates a top, a bottom, opposing sides and opposing ends, with the sides extending between the top and the bottom. Each of the ends engages the top, the bottom and the sides. The frame defines an interior. The guard members are suspended within the interior of the frame, with each of the guard members being formed of metal tubing. The guard members are spaced from each other and located along a length of the frame such that the guard members are oriented substantially parallel to the ends of the frame. The endplates are positioned such that a first of the endplates is located at one of the ends and a second of the endplates is located at another of the ends. The frame, guard members and endplates are operative to form an electric field within the interior of the frame responsive to an electric potential being applied to at least one of the endplates.

An embodiment of a method for providing an electric field comprises: 1) providing an electric-field cage comprising: an electrically insulated frame having a top, a bottom, opposing sides and opposing ends, the sides extending between the top and the bottom, each of the ends engaging the top, the bottom and the sides, the frame defining an interior; guard members suspended within the interior of the frame, each of the guard members being formed of metal tubing, the tubing being shaped such that each of the guard members is rectangular, the guard members being spaced from each other and located along a length of the frame such that the guard members are oriented substantially parallel to the ends of the frame; and metal endplates positioned such that a first of the endplates is located at one of the ends and a second of the endplates is located at another of the ends; and 2) applying an electric potential to at least one of the endplates such that an electric field is formed within the interior of the frame.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

It is desirable to generate calibrated, uniform electric fields in a controlled, repeatable manner in order to investigate concepts related to E-field sensing, corona, ESD, and similar phenomena. In the description that follows, various methods are described that are used to generate these fields. We have called a system that uses these methods an Electric-field cage (or E-field cage).

In this regard, systems and methods for providing electric fields are provided. An embodiment of such a system comprises an electric-field cage capable of generating substantially uniform DC or quasi-static AC electric fields. Of particular interest, such a system can be used for sensor calibration and testing. Generally, the cage functions as a large parallel-plate capacitor that incorporates guard members to control fringing fields. The cage dimensions and endplate voltages can be adjusted to meet the needs of a variety of uses. In one such embodiment, the cage is 8' high by 10' wide (endplates) by 14' long (in the field direction).

Such a cage can be operated in a unipolar configuration, with one endplate grounded, such as for testing grounded sensors. Additionally or alternatively, some of these embodiments can be used in a bipolar configuration, with an intermediate portion, e.g., the center, of the cage being grounded and the endplates driven at voltages with opposite polarities. Arbitrary AC waveforms (up to ±750 V p-p between 10 Hz and 1 kHz) or DC voltages (up to ±60 kV) can be generated with plate separations between 0.6 m and 4.2 m to generate fields up to 2.5 kV/m (AC) or 200 kV/m (DC). Such a system also can implement techniques to reduce corona discharge, which could otherwise be present at higher voltage levels.

Detailed Method of Moments (MoM) models of a cage and the surrounding laboratory were used to predict the accuracy and uniformity of the E-field throughout an embodiment of the cage using CAD modeling software, MoM solver, and post-processing analysis software. Currently, the accuracy of the cage for a variety of applications is on the order of 1% (about 3% in the worst-case scenarios, and in some test scenarios, much better than 1%). The directionality of the E-field in the cage is better than 0.5° over volumes on the order of 1 m³ for anticipated test scenarios. This meets or exceeds world-class standards for E-field calibration (such as IEEE standard 1308-1994 and British standard SB7506 part 2 1994), and does so in a volume that is 15-500× larger than these standards.

Figure 1:
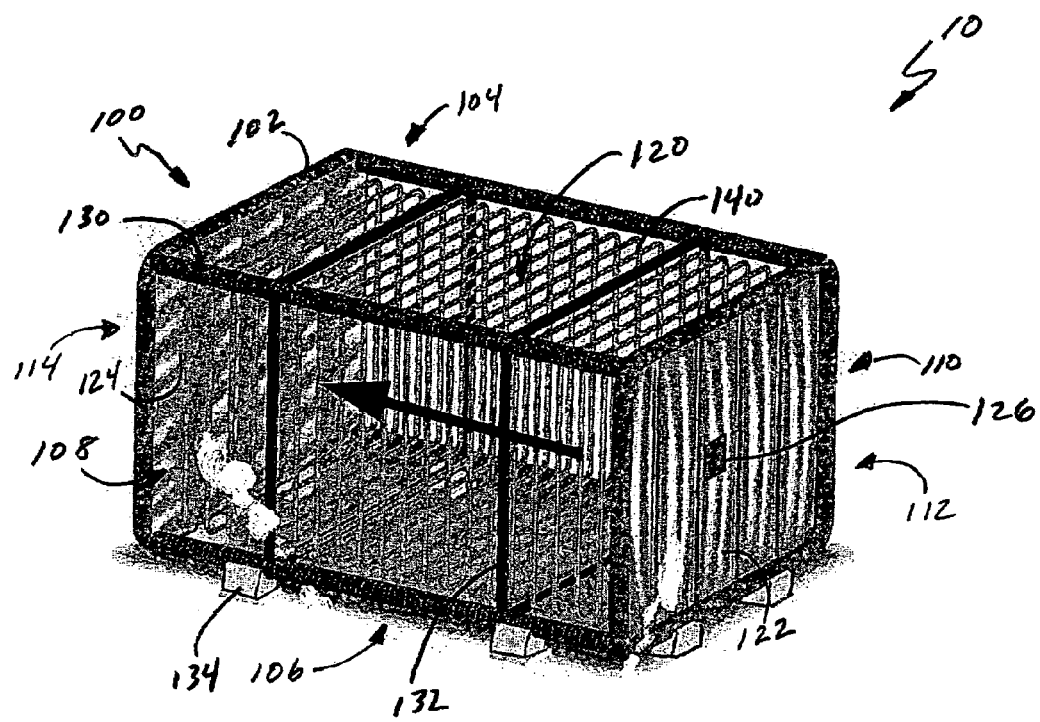
FIG. 1 is a schematic illustration of an embodiment of an electric-field cage of a system for providing electric fields.

In this regard, FIG. 1 is a schematic illustration of an embodiment a system for providing electric fields. Specifically, system 10 incorporates an electric-field cage 100. Notably, components for providing power to the cage are omitted for ease of description.

The cage 100 incorporates an electrically insulated frame 102 that includes a rectangular top 104, a rectangular bottom 106, rectangular opposing sides 108, 110 and rectangular opposing ends 112, 114. The sides extend between the top and the bottom, and each of the ends engages the top, the bottom and the sides so that the frame defines an interior 120. In some embodiments, the frame can be constructed in modular sections that can be joined for forming cages of various sizes.

In this embodiment, the frame is formed of schedule-80 PVC pipe. Notably, various other frame shapes and materials could be used. In this embodiment, PVC has been used due to its electrical properties, e.g., very high volume and surface resistivity, low dielectric constant and loss factor, good mechanical properties, e.g., relatively strong, rigid and easy to machine, and low cost.

The cage also includes endplates 122, 124, with one being located at each of the ends. The endplates are flat and, in this embodiment rectangular, although various other shapes could be used. In this embodiment, the endplates weigh approximately 234 lbs. each and are made of five ⅛"-thick aluminum panels, 2' wide by 8' high, with vertical ribs at the seams to permit moderately heavy sensors to be mounted without appreciable deflection of the endplates. In some embodiments, the size of the endplates could be altered by adding or removing panels.

The flat portion of each endplate is 8' high by 10' wide, although it can be reconfigured, such as to a 6'×8' configuration. The endplates have 6"-diameter tubes around the edges thereof for physical safety and to reduce corona. In this embodiment, endplate 122 has an access panel 126, configured as a hinged door, to permit access to grounded sensors from outside the cage. The access panel can be used with mounting adapters (not shown) to test such grounded sensors.

The frame is modular such that the endplates can be spaced at various distances from each other. In the embodiment of FIG. 1, the endplates can be placed as close as 60.0 cm and as far as 4.20 m apart. The four large (6" diameter) longitudinal supports of the frame, e.g., support 130, have ⅛" grooves every 5.0 cm to permit a number of different configurations. Smaller (3" diameter) vertical supports, e.g., support 132, act as struts to counteract the tension in the guard members. In the largest configuration (shown), the PVC pipe adds about 380 lbs. to the cage.

The entire 1430-lb cage is supported about 1' off the floor by eight insulated base supports, e.g., base support 134. In this embodiment, the base supports are blocks of styrofoam. In other embodiments, various other components could be used to insulate the cage from its surroundings. By way of example, supports formed of other materials, such as PVC, and/or supports for suspending the cage, such as ropes could be used.

Guard members, such as guard member 140, are used to control fringing fields between the endplates. Each of the guard members is generally the same shape as one of the endplates, however, this is not a requirement. In this embodiment, each guard member is made of ⅛"-thick, 2"-diameter aluminum tubing (e.g., circular cross section), although other sizes and cross-sectional shapes can be used in other embodiments. The guard members weigh almost 28 lbs. each for a total of approximately 563 lbs., as 20 such guard members are used in this embodiment. Other embodiments may incorporate more or fewer guard members. For example, the embodiment shown in FIGS. 20 & 21 incorporates 41 guard members.

Each guard member in this embodiment is slightly smaller than each of the endplates and is substantially rectangular with rounded corners. In other embodiments, however, various other shapes can be used. Sizing the guard members smaller than the endplates allows the insulated framing components to be outside of the precision part of the cage. Thus, the framing components have less of an influence on the generated fields.

Figure 2:
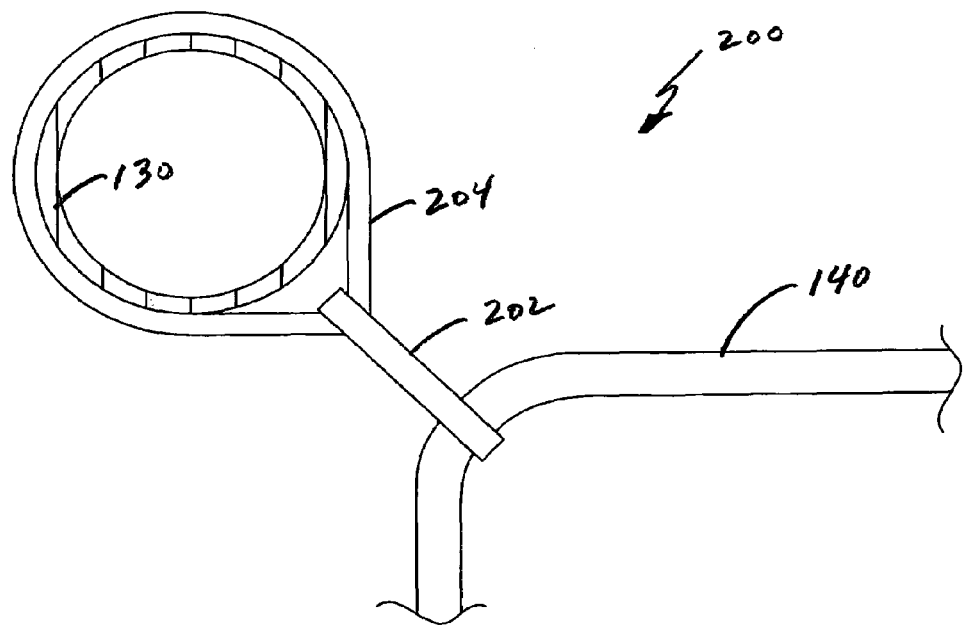
FIG. 2 is a schematic illustration showing detail of an embodiment of an electric-field cage.

The guard members are suspended from the frame as shown in greater detail in FIG. 2. As shown, each of the guard members is suspended by an insulated support assembly 200 so that the guard members are substantially parallel to the endplates. In this embodiment, the guard members are uniformly spaced, however, non-uniform spacing can be used in other embodiments.

The assembly 200 includes a plastic cable tie 202 that is secured to the guard member 140. The cable tie interlocks with a length of rope 204 that is secured to the frame, e.g., support 130. In this embodiment, the rope is ⅛", high-strength, low-stretch rope, and the upper cable ties are high-strength and are doubled to support the weight of the guard members, including the tension of the opposing support assemblies. Low-cost, low-strength cable ties are used in the lower support assemblies so that they can be cut and replaced when physical access to the interior of the cage is required.

The embodiment of FIGS. 1 and 2 permits: (a) very accurate positioning of the guard members; (b) rapid reconfiguration during experimental setups (e.g., if guard members need to be moved between experiments); (c) ease of entry and exit to/from the cage interior; (d) ability to set up a step ladder in between the guard members, or even temporarily add a plywood "floor" on the guard members during setup. This design even permits the lower (low-strength) ties to be cut so that the tubes can be spread to permit easy access to the interior of the cage, and then reconnected quickly and accurately. The heavy-duty cable ties at the top corners of the guard members can be doubled, and can easily support considerable weight. We have demonstrated that a single guard member can support the full weight of a 200-lb man; the design limit is about 5× this amount.

The guard members are electrically connected to the endplates. In this embodiment, a resistor network is used to electrically connect the guard members and the endplates so that a substantially uniform field gradient is created even at the edges of cage. Representative embodiments of resistor networks are depicted in FIGS. 3A and 3B.

Figure 3A:
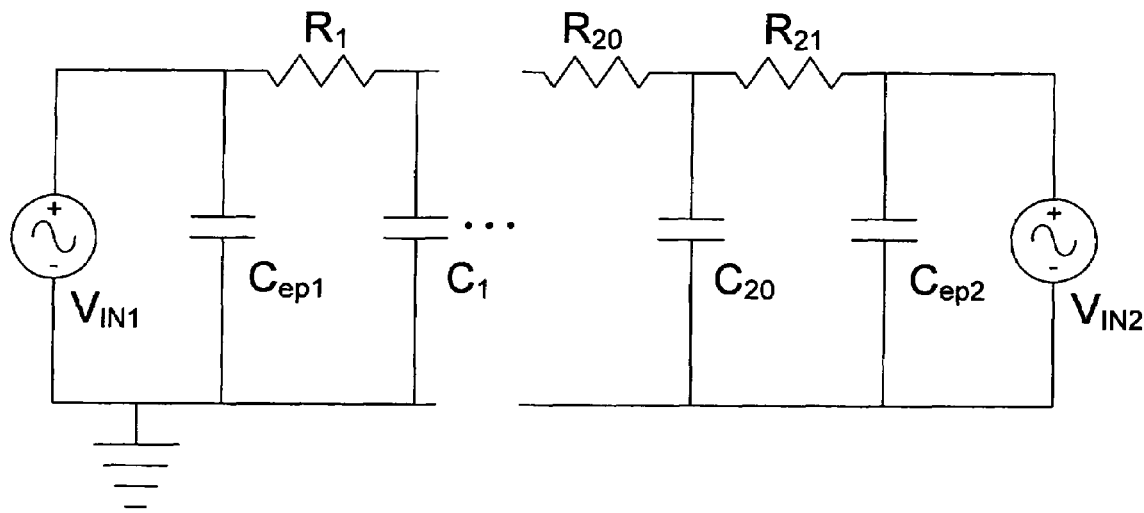
FIG. 3A is a diagram depicting an embodiment of a resistor network.

As shown in FIG. 3A, this embodiment of a resistor network is configured for use when the cage is to be operated in a bipolar mode. In particular, this network incorporates resistors $R_1$-$R_{21}$, with a different one of these resistors being electrically connected between the first endplate and the adjacent guard member, between each pair of adjacent guard members, and between the second endplate and the adjacent guard member. By way of example, the resistors can be 1-kΩ, 5-W resistors for operation at low voltages (up to approximately ±750 V AC) and can be 40-ME, 3.5-W resistors for operation at high voltages (up to approximately ±60 kV DC or more). As another example, twenty-one 2.38-Ω resistors can be used to create a 50-Ω load for operation at relatively high frequencies (hundreds of kilohertz); in this case, the high-frequency cutoff point is limited by the capacitance of the endplates and the guard members. The capacitors (C1-C20) shown in FIGS. 3A and 3B represent the capacitance of each guard tube in its normal operating configuration (~30-80 pF is a typical capacitance for a single guard tube in the embodiment shown).

Figure 3B:
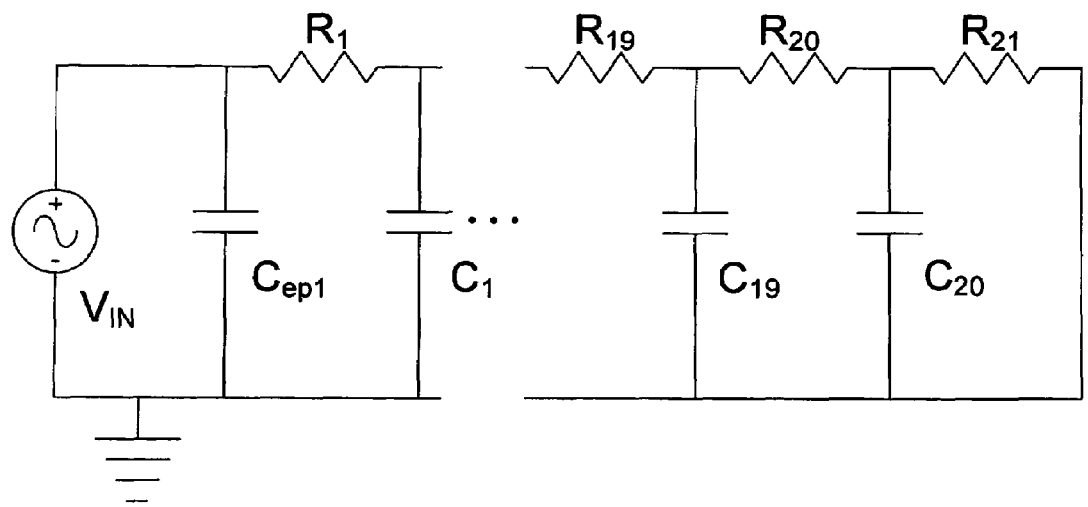
FIG. 3B is a diagram depicting another embodiment of a resistor network.

The endplate capacitance (~300-500 pF in the embodiment shown) is shown in FIGS. 3A and 3B as Cep1 and Cep2. For the unipolar case, the grounded endplate capacitance is negligible and is removed from FIG. 3B. First voltage source $V_{IN1}$ is electrically connected to the first endplate and a second voltage source $V_{IN2}$ is electrically connected to the second endplate. Typically, in bipolar operation, $V_{IN1}=-V_{IN2}$, so that a "virtual ground" is created midway between the endplates, although other configurations may also be used for particular applications.

As shown in FIG. 3B, this embodiment of a resistor network is configured for use when the cage is to be operated in a unipolar mode. In particular, this network incorporates resistors $R_1$-$R_{21}$, with a different one of these resistors being electrically connected between the first endplate and the adjacent guard member, between each pair of adjacent guard members, and between the second endplate and the adjacent guard member. By way of example, the resistors can be 1-k$\Omega$ resistors for operation at low voltages and can be 40-M$\Omega$ resistors for operation at high voltages. Low-impedance resistors (e.g., twenty-one 2.38-$\Omega$ resistors) may be used to provide a 50-$\Omega$ load for operation at frequencies approaching 1 MHz.

Using the resistor network embodiments of FIGS. 3A and 3B, voltages on the guard members are stepped linearly. This forces a substantially uniform potential gradient along the "edges" of the cage, which in turn helps ensure a uniform E-field over a large fraction of the total cage volume. High-impedance, high-voltage resistors can be used to reduce source current in DC applications. Lower-impedance, lower-voltage resistors can be used to increase the operating frequency for AC applications. Notably, in some embodiments, 1% (or better) resistors are used. Additionally or alternatively, hand-selecting and hand-ordering of the resistors can be used to ensure better than 0.1% voltage linearity when desired.

In other embodiments, various other configurations of resistor networks can be used for altering the configuration of the electric field. For instance, it should be noted that the physical environment in which the cage is located can cause irregularities in the E-filed generated by the cage. By way of example, the walls, ceiling and floor can tend to "pull" the E-field out of the cage, resulting in a "bulge" in the flux line plots. The guard members tend to correct most of this bulge, but a 2nd-order error remains. In this regard, a non-uniform resistor network could be used in attempts to correct the 2nd-order field "bulge." An example method to correct the 2nd-order error follows: Given N guard members and N+1 resistors, first pick N points inside the cage where the E-field "bulges" outward as a result of proximity to the walls and floor. For example, the points may be in line with each guard member, and halfway between the centerline of the cage and the bottom of the cage. Second, compute (using Method-of-Moments computer models) the voltage at these points during normal operation of the cage. Third, increase the voltage on each guard member in turn, and measure the voltage increase at each point for each tube. Fourth, from these measurements, form an N×N matrix of coefficients that reflect the ratio of voltage increase at each test point to the voltage increase on each tube. Fifth, solve this N-dimensional set of linear equations to find the set of voltages on the guard members that gives the desired voltages at the test points. Finally, choose a set of resistors that result in the appropriate voltages on the guard members. It is noted that a different set of resistors may be required for different sets of test points, and/or for unipolar and bipolar operation, and/or for different cage dimensions, and/or for measurements involving different-sized objects under test, and/or for different room configurations. Because of this, a resistor network specifically designed for one test can actually cause greater error in a different test. However, this method can be used to minimize the error caused by the cage around a specific object under test, and thus provide a similar test environment as a much larger cage. Also, this method can be used to give the most accurate field with the fewest number of guard tubes (and thus the lowest capacitance), so it may be especially useful for relatively high-frequency operation.

Additionally or alternatively, by using different sets of resistors, and optionally using amplifiers (e.g., 60-120 kV DC Glassman power supplies or 100-200 watt Trek amps), intrinsic safety can be traded for operation at higher voltages (more intense fields) and/or higher currents (generally, higher frequencies).

In operation, the cage essentially functions as a large, parallel-plate capacitor. A horizontal electric field is generated by applying a voltage between the two endplates. The endplates can be driven to opposite DC voltages or 180° out-of-phase for AC waveforms. This bipolar mode of operation provides a virtual ground in the center of the cage that is useful for testing electrically floating sensors. Alternatively, one endplate can be grounded; this unipolar mode of operation is useful for testing ground-based sensors.

The embodiment of the cage shown in FIG. 1 has been demonstrated to operate at up to ±60 kV without generating any measurable space charge (i.e., via corona discharge) that could distort field measurements and/or result in ESD and similar shock hazards to personnel and sensitive electronics. On the other hand, at high cage fields, corona and ESD can be induced on electrically-floating objects within the cage in a controlled and realistic manner, in order to test the susceptibility of electronics to these hazards without artificially connecting the devices under test directly to high-voltage power supplies. The cage can also be driven with an arbitrary function generator (typically at much lower voltages), in order to test the response of E-field sensors or other equipment to specific complex, time-varying E-fields.

Unlike the current IEEE standard (1308-1994), the embodiment of the cage depicted in FIGS. 1 and 2 uses guard members configured as tubes ("guard tubes") to allow the endplates to be moved a large distance apart without resulting in unacceptable fringing. This allows the test volume within the cage to be much larger (e.g., 15× the volume of IEEE standard 1308-1994) without sacrificing accuracy. For example, it does not appear possible to simply "scale up" the IEEE standard cage by 2.5 ($2.5^3 \approx 15$) and fit it into an equivalently-sized lab bay. The guard members also: (a) help shield the inside of the cage from external E-fields (e.g., from static charges on operators and/or equipment, induced charges from power lines, VDTs, etc.); (b) reduce the magnitude and variability of uncontrolled field distortions due to external conductors (e.g., human operators or other equipment outside the cage; (c) provide a set of "frames" from which to suspend a screen panel to create additional "endplates" anywhere within the cage—this aspect will be described in greater detail later.

Through extensive modeling, it is determined that the effectiveness of the guard members in controlling the fringing fields is directly related to the diameter of the guard members, and the "ripple effect" is directly related to the spacing between the guard members.

The structural components of the embodiment of the cage of FIGS. 1 and 2 are specifically designed to reduce distortion of the generated E-field. Specifically: (a) no dielectric material is located inside the cage; (b) the cage is supported by insulating base supports ($\in_r \approx 1.00$ at ELF frequencies); (c) the frame is made of PVC tubes ($\in_r$ of PVC$\approx 3.2$ at ELF frequencies, and the tubes are mostly hollow); (d) thin but high-strength ropes are used to support the guard members and to tension the cage; (e) no additional conductors (i.e., besides the endplates, the guard members, and the resistor wires) are placed inside the cage, or within about 9-15" outside the cage frame, which reduces the resulting distortion of the internal field.

Notably, the cage has vertical endplates and generates a horizontal field. This permits sensors to be suspended from above, or supported from below, without the need for bulky support structures. This design also reduces the potential for dust to settle inside the cage. (Dust on the endplates can become charged during high-voltage operation, and then will be driven by the cage in generally undesirable ways). The cage also can be leveled and made square and plumb to about 1 mm (<1/16") using the base supports and various crossbraces and tensioners (not shown).

We have measured the dimensions of the cage, including the error sources identified above, to ±1 mm (0.03%); all angles have been measured to ±0.05°. In many cases, this meant taking several independent measurements and averaging the results. All of the dimensional errors of the cage have been corrected to less than ±3 mm (0.1%) and ±0.1°. The peak uncorrected error is less than ±6 mm (0.2%). These larger errors were only observed on the right side endplate warp (discussed in more detail below), and in the horizontal dimensions of two guard members.

In general, dimensional errors have a first-order effect on the field: for example, if the actual d is 1% less than the designed d, then the observed E would be expected to be about 1% high. However, some dimensional errors such as the transverse dimensions of the guard members have only a second-order effect. Especially in the center of the cage, the effects of many different dimensional errors may cancel each other out, resulting in a smaller-than-expected field error. But sometimes, the effects of dimensional errors will accumulate, creating unexpectedly large field errors. In many cases, a precise error analysis requires sophisticated modeling; however, the "first-order" approximation serves as a good rule of thumb. Our models confirm that distortions in the E-field resulting from dimensional errors are generally less than 0.1% and 0.1°. The total relative field error in the center of the cage is less than 0.01% and 0.01°, because the effects of many independent dimensional errors are effectively averaged. Since we desire total field errors less than 1%, we have attempted to keep any dimensional errors less than 1%, and preferably less than 0.1%, of the cage dimensions.

We note that, in general, the relative field errors due to dimensional errors are less than the absolute field errors due to field fringing (and ultimately, to the design of the cage), so we have not focused on correcting these errors beyond that which was straightforward to do. Physical measurements of the cage included determination of the linearity of the guard ring voltages. Unless second-order field correction is desired as described above, the guard members are used to force a desired, e.g., uniform, potential gradient along the outside of the cage, where fringing fields would normally result in the greatest errors. In this way, the uniformity of the E-field inside the cage can be improved significantly.

Figure 4:
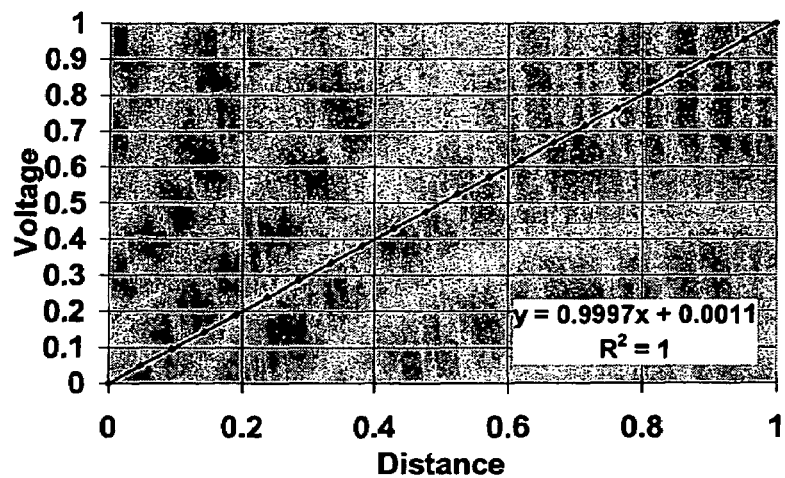
FIG. 4 is a graph depicting normalized guard ring voltage vs. distance along the length of an embodiment of an electric-field cage.

For high-voltage operation, we verified the potentials at each guard member using a very high-impedance electrometer (Kiethley 6517A). All measurements were made with calibrated instruments traceable to NIST with accuracy of at least ±0.2%. FIG. 4 shows the normalized guard member voltage vs. distance along the length of the cage. The line is linear as expected since all resistors are 40.0 MΩ (0.1% specification, and hand-selected for best accuracy).

Once the field errors due to errors in V and d have been accounted for, the only other source of field errors is the geometry itself. Despite efforts to minimize fringing, some distortion remains. Rather than help, the grounded lab serves to increase fringing.

Figure 5:
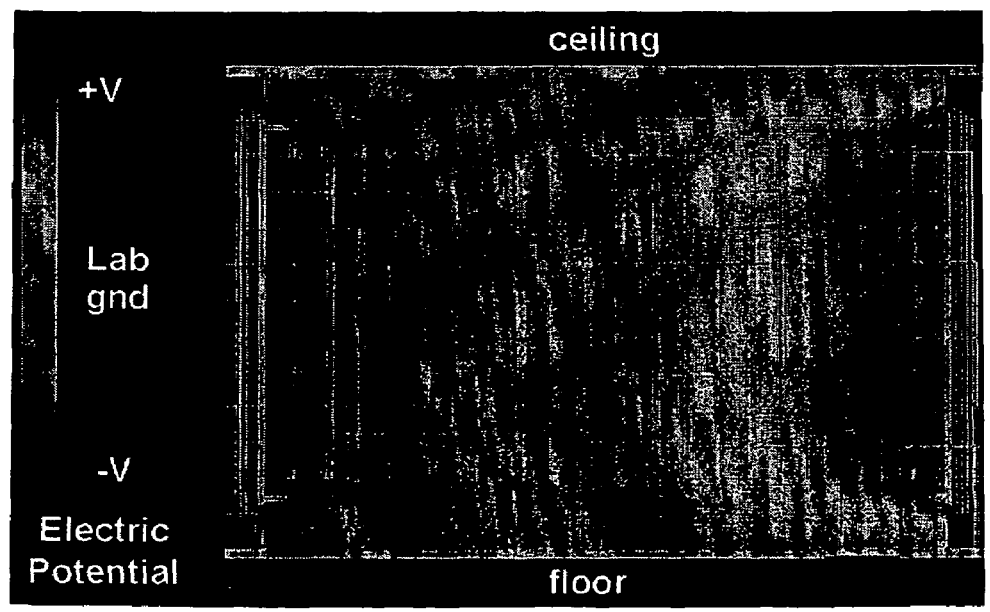
FIG. 5 is a diagram depicting electric potential field in and near an embodiment of an electric-field cage (shown in vertical cross section).

FIG. 5 shows a vertical cross-section of the electric potential field within the cage, and also from the floor to the ceiling. We desire a uniform gradient in the horizontal direction and no gradient in the vertical direction, at least within the cage. And to a great extent, the guard members control the fringing fields and accomplish this goal.

Figure 6:
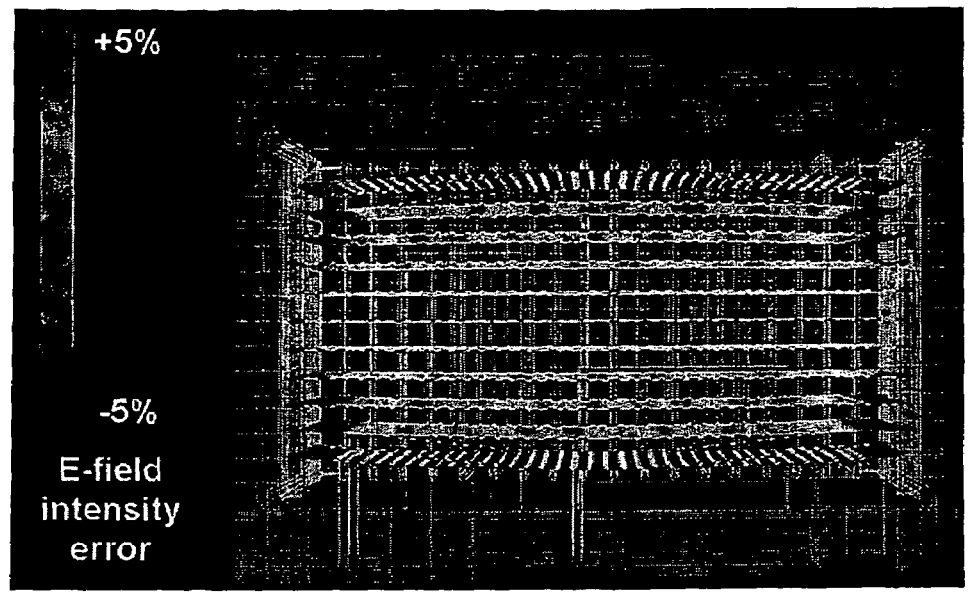
FIG. 6 is a diagram depicting electric flux lines in an embodiment of an electric-field cage.
Figure 7:
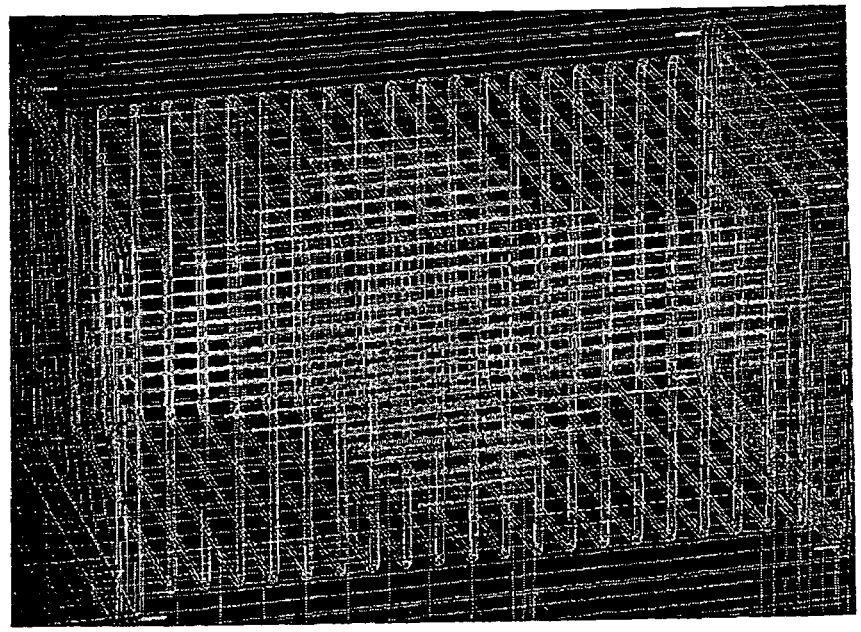
FIG. 7 is a diagram depicting an electric field in and near an embodiment of an electric-field cage (within 5% and 0.5°).
Figure 8:
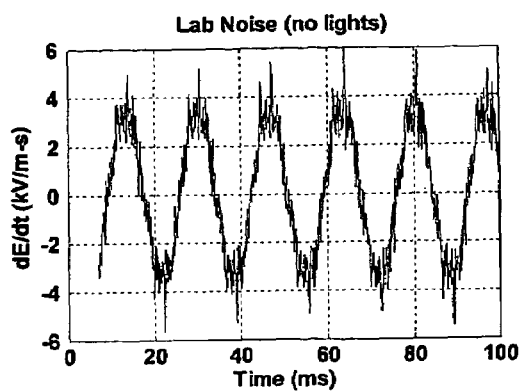
FIG. 8 is a graph depicting lab noise (no lights) in an environment in which an embodiment of an electric-field cage is located.
Figure 9:
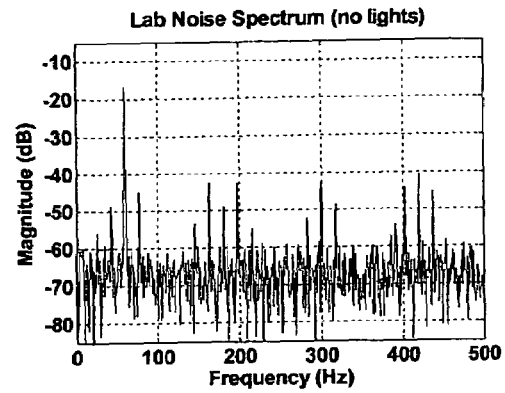
FIG. 9 is a graph depicting lab noise spectrum (no lights) in an environment in which an embodiment of an electric-field cage is located.
Figure 10:
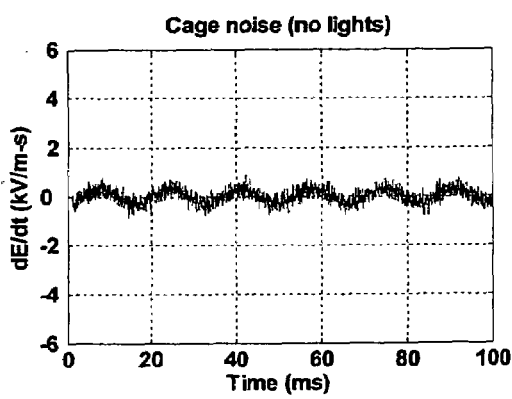
FIG. 10 is a graph depicting cage noise (no lights) in an environment in which an embodiment of an electric-field cage is located.
Figure 11:
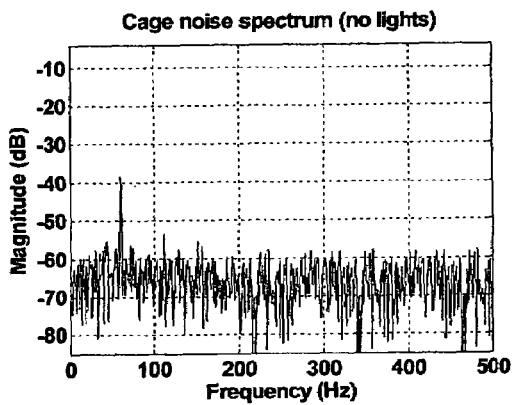
FIG. 11 is a graph depicting cage noise spectrum (no lights) in an environment in which an embodiment of an electric-field cage is located.

FIG. 6 shows electric flux lines, which in air are aligned with the field, and follow the gradient of the potential. There are several noteworthy aspects. First, there is substantial ripple (±10%) near the guard members. However, this ripple averages surprisingly quickly, reducing to <0.1% at distances greater than 20 cm inside the cage. Second, it is easy to see the bow in the flux lines; this bow is the residual fringing field. The bow is much more significant in the vertical direction, partly because the cage is smaller in this dimension, and partly because the floor and ceiling are closer to the cage and thus exert more of a "pull" on the field in the cage. Third, while the E-field in the center of the cage has an absolute error of −1.4%, there is a large "sweet spot" (>1 m$^3$) where the field is very uniform (within +0.6% of the value in the center). The extent of this "sweet spot" is confirmed in FIG. 7, which shows only the portion of the electric field that is both within 5% of the V/d magnitude, and aligned within 0.5° of the axis of the cage. In the bipolar configuration, this is where the sensors (or other object under test) would normally be placed. The field is about 4% high at the center of the endplates, but this is of more academic interest for the bipolar configuration since sensors calibrated using this configuration would be placed in the center of the cage and not near the endplates.

Measurements of E-field lab noise were taken using a calibration probe. The calibration sensor included a conducting plate probe and a low-noise amplifier circuit. This sensor is a D-dot type, which will give an output voltage proportional to the change in electric field. The probe is constructed of standard circuit board insulating material with copper fully covering both sides. The probe area is 0.1 m$^2$ to provide good sensitivity at low frequencies, and was suspended in the cage and lab to measure ambient e-field noise levels.

Figure 12:
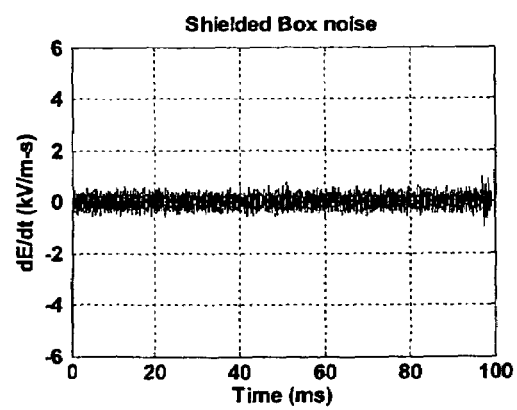
FIG. 12 is a graph depicting shielded box noise in an environment in an environment in which an embodiment of an electric-field cage is located.
Figure 13:
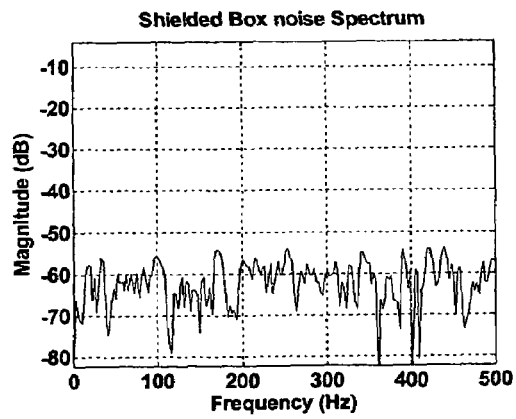
FIG. 13 is a graph depicting shielded box noise spectrum in an environment in which an embodiment of an electric-field cage is located.
Figure 14:
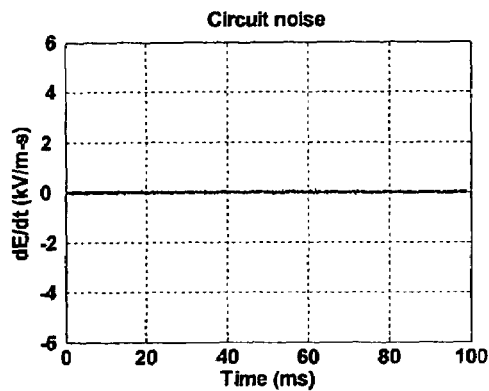
FIG. 14 is a graph depicting circuit noise of a cage probe amplifier related to an embodiment of an electric-field cage.
Figure 15:
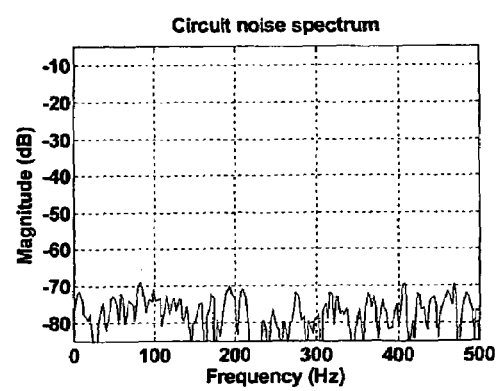
FIG. 15 is a graph depicting circuit noise spectrum of a cage probe amplifier related to an embodiment of an electric-field cage.
Figure 16:
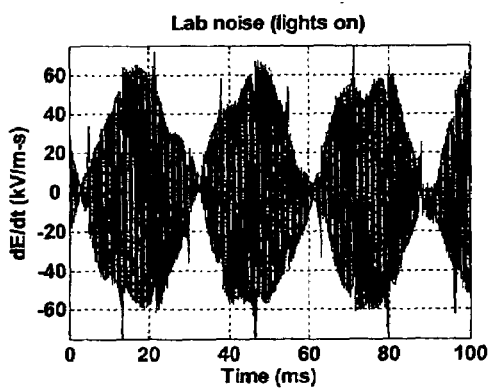
FIG. 16 is a graph depicting lab noise (lights on) in an environment in which an embodiment of an electric-field cage is located.
Figure 17:
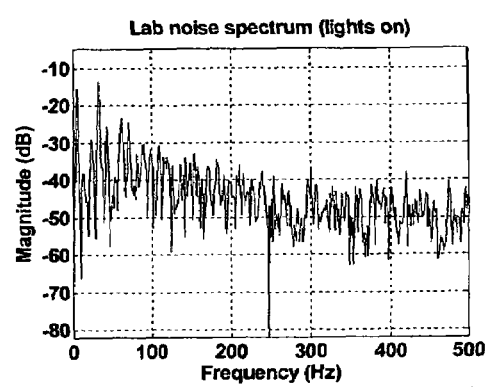
FIG. 17 is a graph depicting lab noise spectrum (lights on) in an environment in which an embodiment of an electric-field cage is located.
Figure 18:
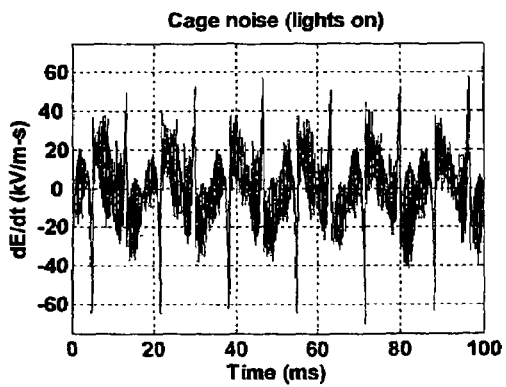
FIG. 18 is a graph depicting cage noise (lights on) in an environment in which an embodiment of an electric-field cage is located.
Figure 19:
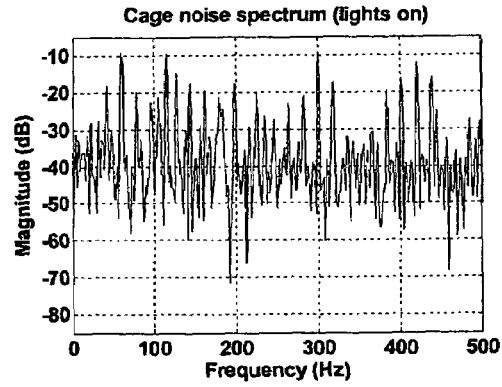
FIG. 19 is a graph depicting cage noise spectrum (lights on) in an environment in which an embodiment of an electric-field cage is located.

As expected, the predominant source of noise in the laboratory was due to 60-Hz power line fields. Fields from fluorescent lighting electronics in the lab also added considerable noise at multiple frequencies. This could largely be controlled by performing measurements with the overhead fluorescent lights off. FIGS. 8-19 show typical noise signal and spectrum plots. These measurements were performed in the open lab area (FIGS. 8 and 9 no lights, FIGS. 16 and 17 lights on), inside the cage with the endplates grounded (FIGS. 10 and 11 no lights, FIGS. 18 and 19 light on) and inside a shielded box (FIGS. 12 and 13). Measurements of the amplifier circuit noise were also taken (FIGS. 14 and 15).

From these measurements, it is seen that the cage provides good shielding from low-frequency noise in the lab. With the 20-cm spacing of the guard members, the ELF noise is reduced by more than 20 dB. This potentially allows accurate generation of low-frequency fields at the lower limits of operation. Performing measurements with the overhead fluorescent lights off may also significantly improve performance in this area. When higher voltages and frequencies are applied to the endplates, noise levels should be well below the generated signal levels. We have also shown that the low-noise amplifier circuit does not add any appreciable noise to the measurements.

The following table summarizes the results of the noise measurements, referred back to the electric field levels present.

| Probe Location | Conditions | Vrms (mV) | Probe Current (nA) | dE/dt (V/m − s) | E (V/m) |
|---|---|---|---|---|---|
| Open Lab | Lights off | 183 | 1.83 | 2065 | 5.5 |
| Inside cage | Lights off | 24 | 0.24 | 270 | 0.7 |
| Open Lab | Lights on | 2200 | 22.0 | 24830 | 66.0 |
| Inside Cage | Lights on | 1220 | 12.2 | 13770 | 36.5 |
| In Shielded Box | N/A | 28 | 0.28 | 316 | N/A |
| No probe | Circuit only | 5 | 0.05 | 56 | N/A |
| Theoretical | Circuit only | 7 | 0.07 | 79 | N/A |

With any laboratory device driven to high voltage levels, safe operating procedures should be followed. For high-voltage operation, a primary concern is to limit both the stored energy (for instantaneous discharges) and the current (for longer discharges) that any user might encounter if they were to accidentally contact an energized surface. Stored energy of each part of the supply path should be considered when calculating the potential shock hazard. This includes the power supply, cables, and the structure of the cage itself. Safe operating procedures will detail the precautions required to protect operators of the cage during normal operations.

Although full operating parameters have not been determined, we have verified that the cage is capable of operating at DC voltages up to 60 kV with no measurable corona discharge, and less than 100 μA of supply current through the resistor network. This is possible with the use of 40-MΩ high-voltage resistors between the guard members and the smooth edges of all the high-voltage surfaces to prevent any corona discharge. We have also driven the cage with a custom AC supply capable of voltages up to 750 V from 0.1 to 20 kHz. Current limiting also can be used to limit AC currents to intrinsically-safe levels.

For safe high-voltage DC operation, we note that 200 μA is "annoying" but typically not "painful"; the same typically is true of 100-mJ impulsive discharges. For DC operation, we can limit the high-voltage power supply to 200 μA. However, the stored energy is $E=\frac{1}{2}CV$. The measured capacitance of the cage structure and power supply cables is 896 pF. If we require the stored energy E to be less than 100 mJ, then we must limit V to be less than 14.9 kV. Note that at 60 kV, the stored energy is $4^2=16$ times as high as at 14.9 kV (1.6 J instead of 0.1 J). This level of energy discharge would be in the "painful" category. Therefore, for "safe" DC operation, we should limit the high-voltage power supply to 200 μA, and we should not operate the cage at potentials above 14.9 kV without a physical barrier (e.g., a grounded conducting shield, or at least a grounded table or lab bench) between any operators and the cage.

For safe AC operation, the electric potentials are low enough that stored energy should not be a hazard. However, unsafe currents (>200 μA) can be obtained even at "low" voltages (100-750 V peak). Note that $Q_{peak}=V_{peak}C$. Suppose we limit a sinusoidal voltage to 100 V (peak), and we verify that the capacitance of the supply, cables, and cage is 2000 pF. Then $i_{peak}=2\pi f Q_{peak}=2\pi f V_{peak}C<200$ μA. In this case, we should keep f<160 Hz. For 10-V operation, we can operate the cage at frequencies as high as 1.6 kHz with intrinsic safety. Note that at 10 V, our skin normally provides adequate insulation to protect us from shock hazards, unless it is wet and we are connected to a good ground, so we are probably "safe" running a 10-V supply at even higher frequencies without limiting the supply current to 200 μA. But above 10 V (peak), we should either limit the supply current to 200 μA or employ a physical barrier (or both). For example, if we ran the cage at 750 V (peak) and 10 kHz, and if Q=2000 pF, then the supply current would be $i_{peak}=2\pi f V_{peak}C=(62.8\text{ k rad/s})(750\text{ V})(2\text{ nF})=94.2$ mA, which is not only above the maximum tolerable current (about 10 mA), but has the potential to cause ventricular fibrillation (0.5% chance).

Figure 20:
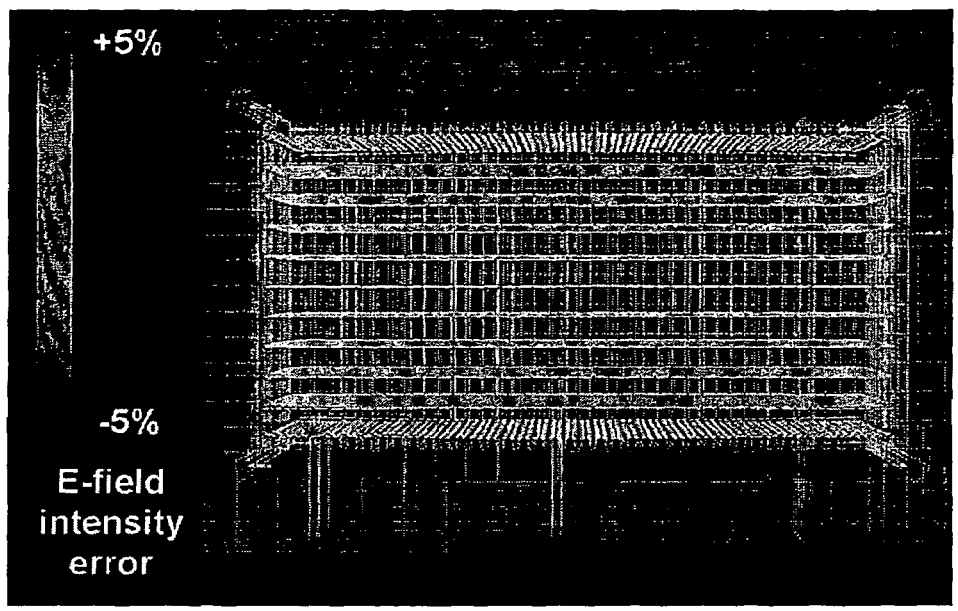
FIG. 20 is a diagram depicting electric flux lines in another embodiment of an electric-field cage.
Figure 21:
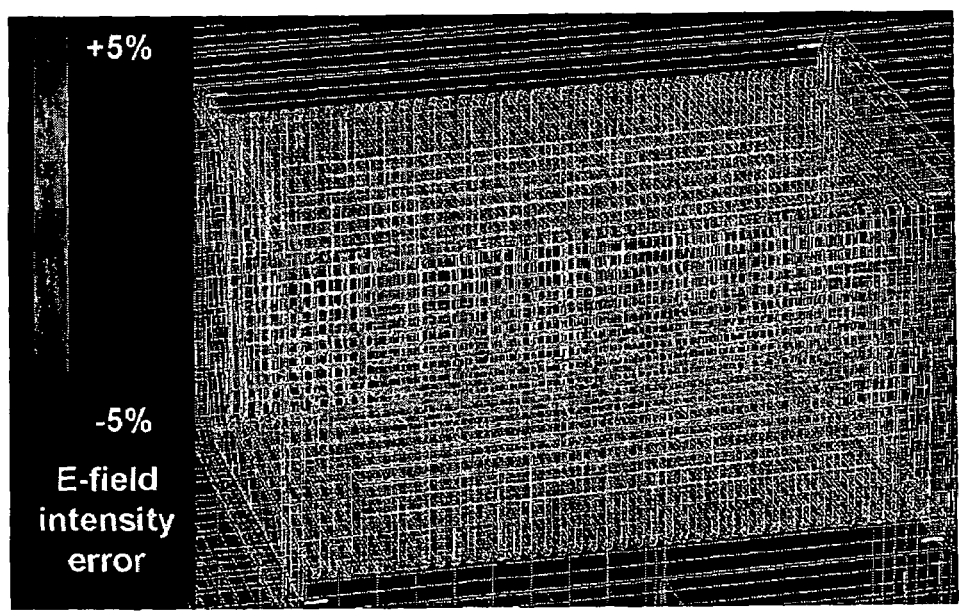
FIG. 21 is a diagram depicting an electric field map of the embodiment of FIG. 20.

It is possible to improve the accuracy of the field within the entire cage by adding more guard members. In this regard, FIGS. 20 and 21 show results for an embodiment that incorporates twice as many guard members as the embodiment of FIG. 1. As shown in these figures, doubling the number of guard members reduces the absolute field errors to within 0.5% over the majority of the cage volume. The tradeoff for this increased accuracy is greater cost, reduced physical access to the interior of the cage, and greater capacitance (lower-frequency operation). Clearly various other numbers and configurations of guard members could be used.

Figure 22:
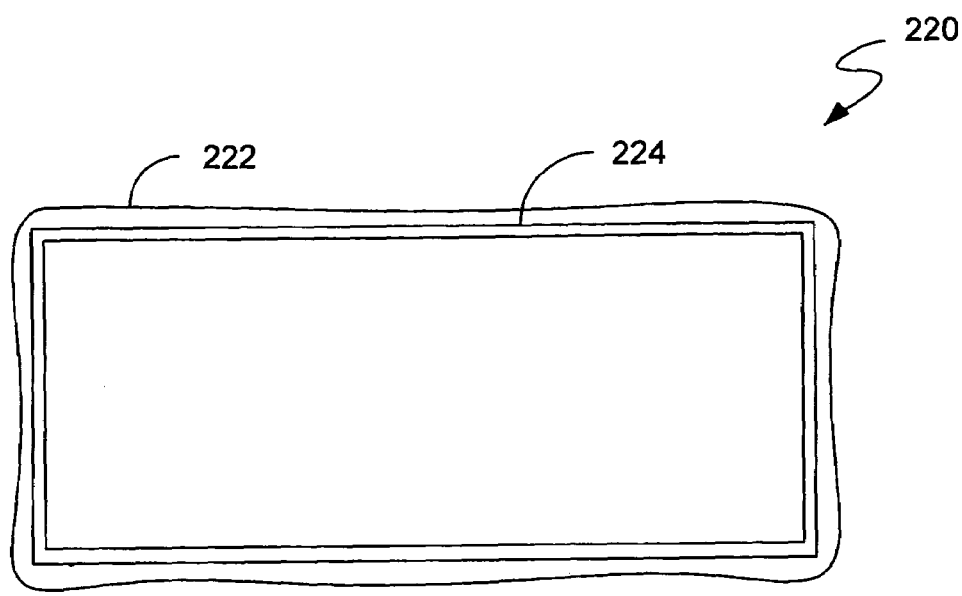
FIG. 22 is a schematic diagram depicting an embodiment of an electric-field cage at least partially surrounded by a shield.

In order to provide additional attenuation such as for external ELF fields from power lines and lights (especially fluorescent lights), a shield can be used. FIG. 22 schematically depicts an embodiment of a system 220 that incorporates such a shield. In this embodiment, the shield 222 at least partially surrounds cage 224. Although capable of being formed of various materials, the shield preferably is formed of conductive cloth. Such a shield could be suspended about the exterior of the cage, such as at a distance of approximately 9"-18" from the frame. In addition to shielding the cage from external ELF fields, the shield can potentially contain fields, currents and/or shock hazards generated by the cage.

The intensity of the E-field generated by the cage can be increased by increasing the voltage on the endplates, but it can also be increased by reducing the distance between the endplates. In general, the "bulge" caused by the fringing fields will also be reduced if the distance between the endplates is reduced. A smaller cage volume will result in greater distortion of the E-field around the object under test, but in some cases, the increase in distortion will be less than the decrease in fringing, so a more accurate test is possible.

If the full volume of the cage is not needed for a particular purpose, accuracy can be improved by bringing the endplates closer together. While at least some embodiments of the cage are designed to permit sections of the frame to be added or taken away as needed, this can be a time-consuming process. A potentially quicker solution, especially if the "short" configuration is only needed for a short time, is to add one or more movable panels between the endplates. In this regard, the term "panel" is used to describe the installed shape of the movable panel and does not connote rigidity, as such movable panels typically are installed by being placed under tension and drawn taught across the interior of the cage.

Figure 23:
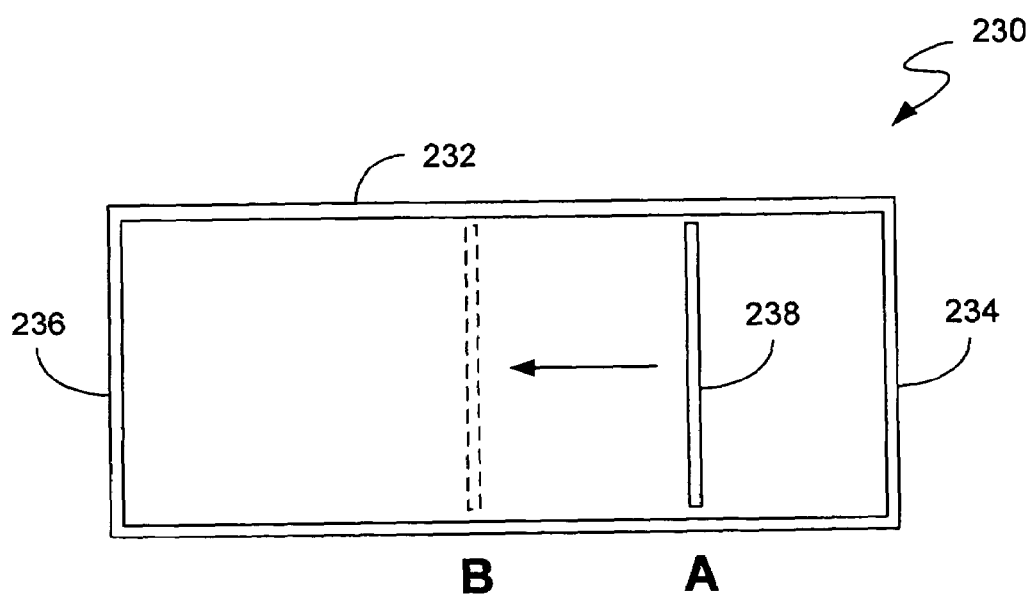
FIG. 23 is a schematic diagram depicting an embodiment of an electric-field cage that incorporates a movable panel.

FIG. 23 schematically depicts an embodiment of a system 230 that incorporates a movable panel. In particular, cage 232 includes endplates 234 and 236, as well as movable panel 238. Typically, the movable panel is attached to and mounted across one of the guard members, although various other forms of attachment could be used. Notably, the movable panel can be moved once installed, such as from position A to position B.

The movable panel can be formed of various conductive materials to provide an adjustable "endplate." That is, the movable panel, which in this embodiment is a piece of conductive screen material, can be positioned to alter the functional dimensions of the cage. For instance, without the movable panel installed in the cage, the functional length of the cage is determined by the distance between the endplates 234 and 236. However, when the movable panel is installed in position A, the functional length can be either the distance between endplate 234 and the panel or the distance between the endplate 236 and the panel depending on which of the endplates is energized. Notably, when a sensor is placed within the field generated within the cage, the movable panel creates a shorter field region that results in a greater sensor-cage capacitance.

A leveling and tensioning system is used to keep the endplates as parallel as possible, and to keep the field as perpendicular to the endplates as possible. The leveling system incorporates a variable-height base under each Styrofoam support. The tensioning system includes eight thin, electrically-insulating, high-strength ropes, each with a non-conducting turnbuckle or similar tensioning device. Two ropes extend from each corner of the frame to the two opposite corners on the top (or bottom) and side. In this way, the eight ropes form four large "X" cross-braces on the top, bottom, and sides of the cage.

Three basic steps are used to level and tension the cage. First, the base of the cage is "squared up" using a laser square until the main insulating tubes (130) are perpendicular to the endplates in the horizontal planes. Second, the eight Styrofoam blocks (134) positioned under the endplates and the frame (near the struts) are leveled using a laser level. Third, vertical skew is reduced by tensioning the appropriate cross-bracing until the endplates are vertical and perpendicular to the main insulating tubes in the vertical planes.

Figure 24:
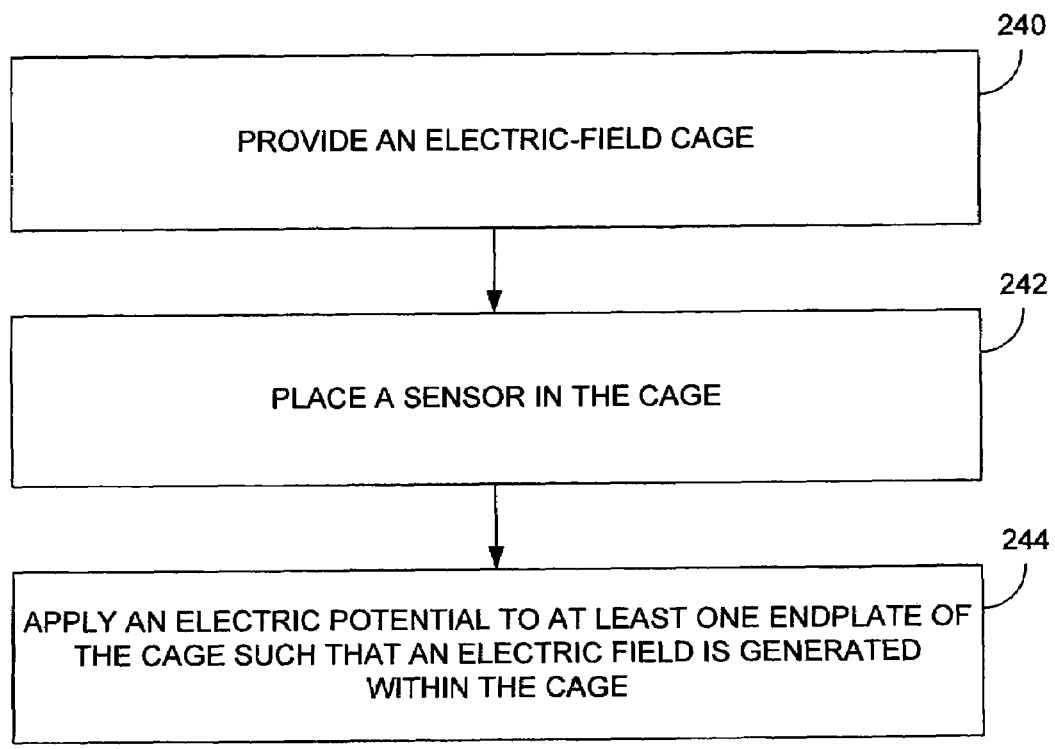
FIG. 24 is a flowchart illustrating functionality of an embodiment of a system for providing electric fields.

FIG. 24 is a flowchart illustrating functionality of an embodiment of a system for providing electric fields. In this regard, the functionality (or method) may be construed as beginning at block 240, in which an electric-field cage (such as described herein, for example) is provided. In block 242 a sensor is placed within the cage. Thereafter, such as depicted in block 244, an electric potential to at least one of the endplates such that an electric field is formed within the interior of the frame, thereby permitting testing of the sensor. Many other embodiments are also possible. For example, another field source, and/or a second sensor, and/or an interfering "target" may also be placed in the cage.

It should be emphasized that many variations and modifications may be made to the above-described embodiments. All such modifications and variations are intended to be included herein within the scope of this disclosure and protected by the following claims.

We claim:

1. A system for providing an electric field comprising:
an electrically insulated frame having a rectangular top, a rectangular bottom, rectangular opposing sides and rectangular opposing ends, the sides extending between the top and the bottom, each of the ends engaging the top, the bottom and the sides, the frame defining an interior;
guard members suspended within the interior of the frame, each of the guard members being formed of metal tubing exhibiting a circular cross section, the tubing being shaped such that each of the guard members is rectangular, the guard members being spaced from each other and located along a length of the frame such that the guard members are oriented substantially parallel to the ends of the frame; and
metal endplates positioned such that a first of the endplates is located at a first of the ends and a second of the endplates is located at a second of the ends;
wherein the frame, guard members and endplates are operative to form an electric field within the interior of the frame responsive to an electric potential being applied to at least one of the endplates and the guard members.

2. The system of claim 1, further comprising a resistor network electrically coupled to the guard members such that voltage is linearly stepped across the guard members.

3. The system of claim 1, wherein the first of the endplates is repositionable with respect to the frame such that altering a location of the first of the endplates alters a resultant electric field generated within the interior of the frame.

4. The system of claim 1, further comprising a movable panel positioned between the endplates and operative to be relocated with respect to the frame such that altering a location of the movable panel alters a resultant electric field generated within the interior of the frame.

5. The system of claim 4, wherein the movable panel comprises a conductive screen held flat under tension by a guard member.

6. The system of claim 1, further comprising electrically insulated supports operative to engage the frame and separate the frame from a surface used to support the frame.

7. The system of claim 1, further comprising a network of resistors electrically connected to the guard members, the network of resistors being operative to affect a configuration of the electric field generated.

8. The system of claim 1, wherein the frame is formed of PVC tubing.

9. The system of claim 1, wherein corners formed between the top, the bottom, the sides and the ends are rounded such that an affinity to produce corona discharge is reduced.

10. The system of claim 1, further comprising an access panel mounted to at least one of the endplates, the access panel providing access to the interior of the frame.

11. The system of claim 1, further comprising a shield surrounding at least a portion of an exterior of the frame, the shield being operative to prevent an undesired electrical discharge from exiting the shield.

12. The system of claim 1, further comprising means for preventing an undesired electrical discharge.

13. A system for providing an electric field comprising:
an electrically insulated frame having a top, a bottom, opposing sides and opposing ends, the sides extending between the top and the bottom, each of the ends engaging the top, the bottom and the sides, the frame defining an interior;
guard members suspended within the interior of the frame, each of the guard members being formed of metal tubing, the guard members being spaced from each other and located along a length of the frame such that the guard members are oriented substantially parallel to the ends of the frame; and
endplates positioned such that a first of the endplates is located at one of the ends and a second of the endplates is located at another of the ends;
wherein the frame, guard members and endplates are operative to form an electric field within the interior of the frame responsive to an electric potential being applied to at least one of the endplates.

14. The system of claim 13, wherein the guard members are formed of aluminum tubing, bent into a continuous loop with rounded corners to reduce affinity to produce corona.

15. The system of claim 13, wherein the frame, guard members and endplates are operative to form an electric field within the interior of the frame, without exhibiting corona discharge, responsive to an electric potential of up to ±60 kV being applied to at least one of the endplates.

16. The system of claim 13, further comprising a movable panel positioned between the endplates and operative to be relocated with respect to the frame such that altering a location of the movable panel alters a resultant electric field generated within the interior of the frame, the movable panel comprising a sheet of metal screen.

17. A method for providing an electric field comprising:

providing an electric field cage comprising:

an electrically insulated frame having a top, a bottom, opposing sides and opposing ends, the sides extending between the top and the bottom, each of the ends engaging the top, the bottom and the sides, the frame defining an interior;

guard members suspended within the interior of the frame, each of the guard members being formed of metal tubing, the tubing being shaped such that each of the guard members is rectangular, the guard members being spaced from each other and located along a length of the frame such that the guard members are oriented substantially parallel to the ends of the frame; and metal endplates positioned such that a first of the endplates is located at one of the ends and a second of the endplates is located at another of the ends; and applying an electric potential to at least one of the endplates such that an electric field is formed within the interior of the frame.

18. The method of claim 17, further comprising operating the electric-field cage in a bipolar mode, in which the electrical potential is applied across both of the endplates.

19. The method of claim 17, further comprising operating the electric-field cage in a unipolar mode, in which the electrical potential is applied to only one of the endplates and the other of the endplates is grounded.

20. The method of claim 19, further comprising:

providing a movable endplate positioned between the endplates; and moving the movable endplate with respect to the frame such that altering a location of the movable endplate alters a resultant electric field generated within the interior of the frame.

* * * * *